US008616455B2

(12) United States Patent  (10) Patent No.: US 8,616,455 B2
Zambon  (45) Date of Patent: Dec. 31, 2013

(54) RADIO FREQUENCY IDENTIFICATION DEVICE IN POLYCARBONATE AND ITS MANUFACTURING METHOD

(75) Inventor: Carina Zambon, Mougins (FR)

(73) Assignee: ASK S.A., Sophia Antipolis (FR)

( * ) Notice: Subject to any disclaimer, the term of this patent is extended or adjusted under 35 U.S.C. 154(b) by 0 days.

(21) Appl. No.: 13/181,368

(22) Filed: Jul. 12, 2011

(65) Prior Publication Data

US 2012/0175422 A1   Jul. 12, 2012

(30) Foreign Application Priority Data

Jul. 12, 2010 (FR) .................................. 10 02929

(51) Int. Cl.
  *G06K 19/06*  (2006.01)
(52) U.S. Cl.
  USPC ............ 235/488; 235/380; 235/451; 235/492
(58) Field of Classification Search
  USPC .................. 235/451, 488, 492, 375, 380, 487
  See application file for complete search history.

(56) References Cited

U.S. PATENT DOCUMENTS

| 7,597,266 | B2 | 10/2009 | Benato | 235/492 |
| 7,688,209 | B2 | 3/2010 | Halope | 340/572.8 |
| 2006/0181478 | A1* | 8/2006 | Benato | 343/895 |
| 2007/0176273 | A1* | 8/2007 | Wolny | 257/679 |
| 2007/0194135 | A1* | 8/2007 | Inoue et al. | 235/492 |
| 2008/0131669 | A1* | 6/2008 | Michalk | 428/196 |
| 2008/0275327 | A1* | 11/2008 | Faarbaek et al. | 600/382 |
| 2008/0283615 | A1* | 11/2008 | Finn | 235/488 |
| 2009/0314842 | A1* | 12/2009 | Charrin | 235/492 |
| 2010/0001079 | A1* | 1/2010 | Martin et al. | 235/492 |
| 2010/0026442 | A1* | 2/2010 | Schaffler | 336/232 |
| 2010/0181385 | A1* | 7/2010 | Brod | 235/492 |

FOREIGN PATENT DOCUMENTS

WO   WO 2010/060755   6/2010

* cited by examiner

*Primary Examiner* — Tuyen K Vo
(74) *Attorney, Agent, or Firm* — James C. Lydon

(57) ABSTRACT

The invention concerns a method for manufacturing a radio frequency identification device (RFID), featuring a flat and flexible substrate made of polycarbonate equipped with an antenna (14) composed of conductive ink fully encased in the polycarbonate and a chip or integrated circuit module (29) connected to the antenna, the antenna formed by the winding of several turns features a turn overlap zone, an insulating strip of dielectric material separating the turns of the antenna in the overlap zone, the edges of the device being completely uniform so that no lines of demarcation between the various layers are visible, thereby preventing all attempt of delamination of the device over its thickness.

10 Claims, 2 Drawing Sheets

Figure 1:
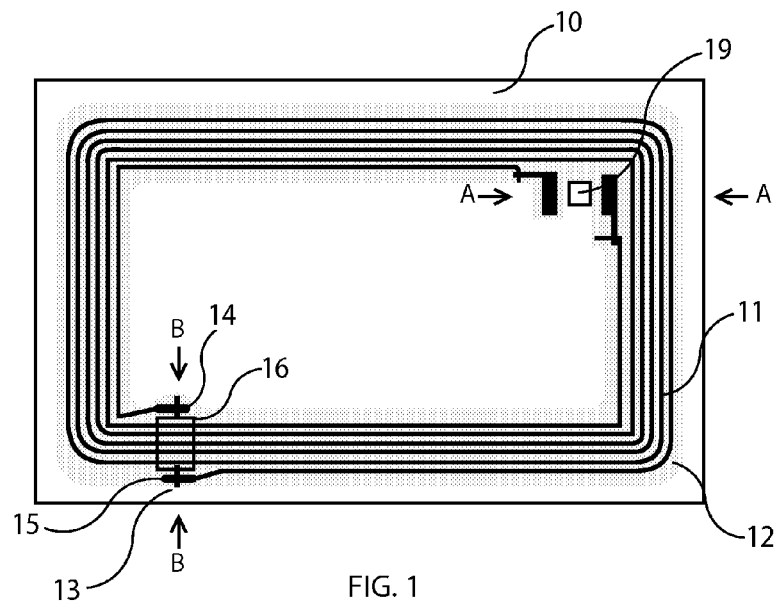

RADIO FREQUENCY IDENTIFICATION DEVICE IN POLYCARBONATE AND ITS MANUFACTURING METHOD

This invention concerns the field of documents, articles of value and security containing a contactless electronic data exchange device and specifically concerns a radio frequency identification device (RFID) and its manufacturing method.

A contactless radio frequency identification device (RFID) is a device essentially made up of an antenna which is embedded in a support of the device and a chip connected to antenna contacts. These devices allow the exchange of information with the outside by remote, and therefore contactless, electromagnetic coupling, between their antenna and a second antenna located in the associated reader. These devices are currently used in a large number of applications and particularly to identify persons moving about in controlled access zones or transiting from one zone to another. The device is generally formed on a flat and flexible support in the format of a bank card or in a format enabling it to be inserted into a security or value document. Such RFIDs are commonly referred to as "inlays". Generally speaking, the chip is connected directly to the antenna contacts by the "flip-chip" method. However, the chip may also be encased in a module for enhanced protection.

Information is exchanged between the RFID and the reader and particularly the information stored in the chip that relates to the identification of the holder of the object on which the RFID is located and his/her authorization to enter a controlled access zone, for example.

Currently, such RFIDs can be manufactured according to several manufacturing methods. RFIDs for which the antenna is printed on a thermoplastic support are considered here. One of the processes consists in laminating together several layers of different materials such as paper for the antenna support and thermoplastic for the upper and lower layers. The drawback of the RFID obtained by such a method resides in the fact that it delaminates over its thickness and, as a result, is unsuitable for use over a period of several years as may be the case with identity cards. On the other hand, the use of the same material, such as thermoplastic, for the three layers, does not resolve the delamination problem and poses additional problems at the time of lamination. Actually, the lack of flexibility and elasticity of the overlaid layers may crack the antenna and cause the electrical connection between the antenna and the chip to break during increases in pressure. Furthermore, the increase in temperature during the lamination step causes the support to bend which may also result in cracking in the antenna compounded by the excess thickness at the location of the overlap of the coils due to the double thickness of conducting material forming the coils and insulating material used to separate and insulate the coils between themselves.

In addition, the RFIDs based on a wire antenna do not present the same drawbacks since the copper wire does not break under the pressure effect but rather tends to mold itself into the thermoplastic. Furthermore, owing to its thinness in the order of 25 µm and the fact that the copper wire is sheathed and thus insulated, its use enables to avoid placement of the insulating layer between the overlaid turns and to obtain excess thickness in the order of 50 µm in the areas where the turns overlap, thus posing very little problem.

This is why the purpose of the invention is to provide a method for manufacturing an RFID for which the antenna is made by printing on a thermoplastic material, which resolves the problems of the printed antenna cracking during the lamination step.

Another purpose of the invention is to provide an RFID that does not present the risk of delamination over time.

The purpose of the invention is therefore to provide a method for manufacturing a radio frequency identification device (RFID) featuring a flat substrate equipped with an antenna and a chip connected to the antenna, the antenna formed by the winding of several turns comprises a zone where the turns overlap, and an insulating strip of dielectric material separating the overlaid antenna turns where they overlap, the method including the following steps:

a) producing the antenna consisting in printing turns, two contacts using conductive ink and an insulating strip made of dielectric material at the location of the overlap of the turns, and subjecting the support to heat treatment in order to bake said ink, b) connecting said chip to the support on the side of said antenna, c) overlaying a second layer on the substrate on the side of the antenna, this second layer featuring a first perforation centered on the chip and a second perforation centered on the insulating strip of antenna overlap zone, d) overlaying a third layer on the second layer, and e) laminating the three layers together.

Figure 2:
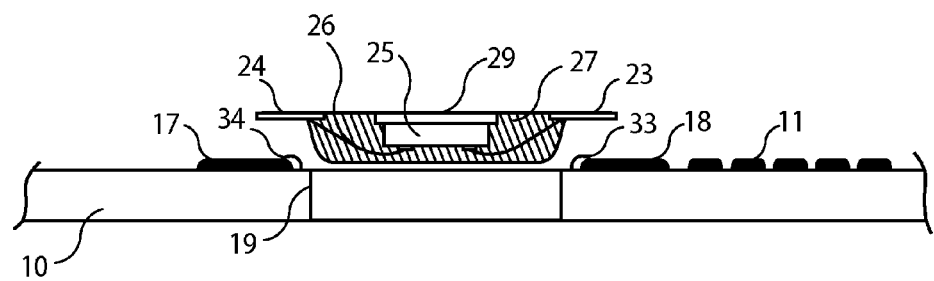
Figure 3:
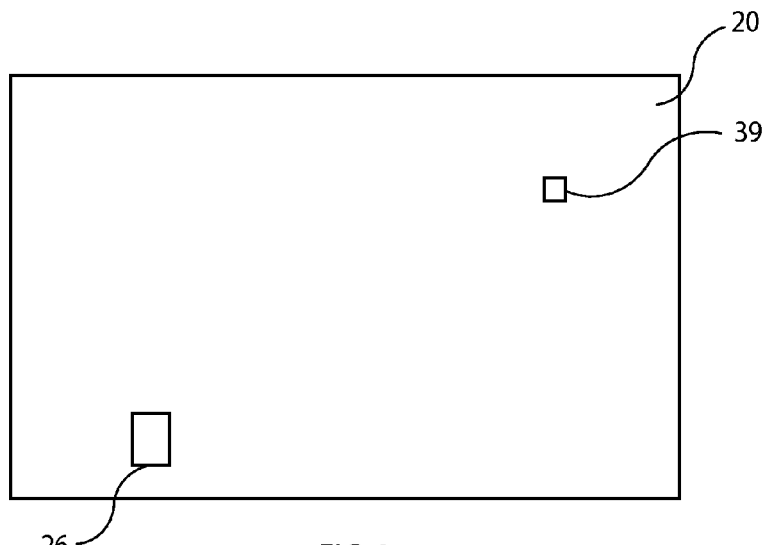
Figure 4:
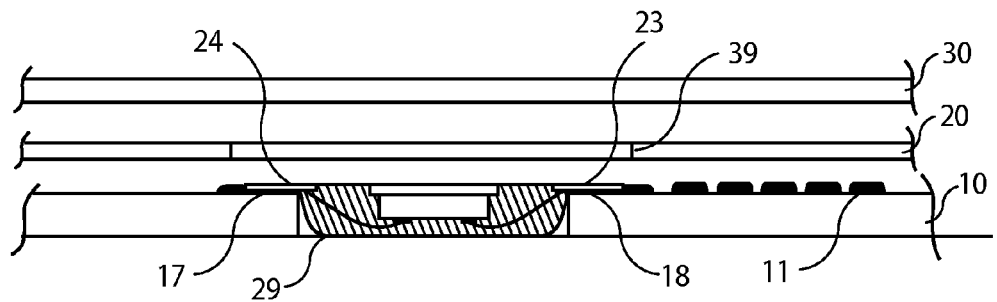

The purposes, objects and characteristics of the invention will become more apparent from the following description when taken in conjunction with the accompanying drawings in which:

FIG. 1 represents a front view of the layer supporting the radio frequency device, FIG. 2 represents a cross sectional view along axis A-A of the layer supporting the radio frequency device of FIG. 1, FIG. 3 represents a front view of the second layer of the RFID support according to the invention, FIG. 4 represents a cross sectional view of the radio frequency device according to the invention.

Figure 5:
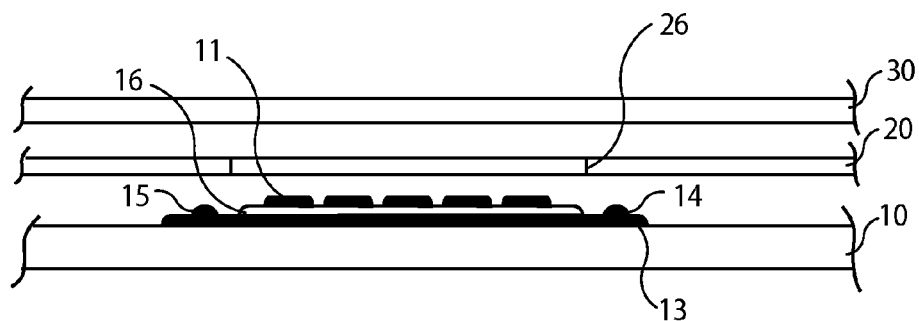

FIG. 5 represents a cross-sectional view of the antenna support 10 along axis B-B of FIG. 1 together with second and third layers 20 and 30.

Figure 6:
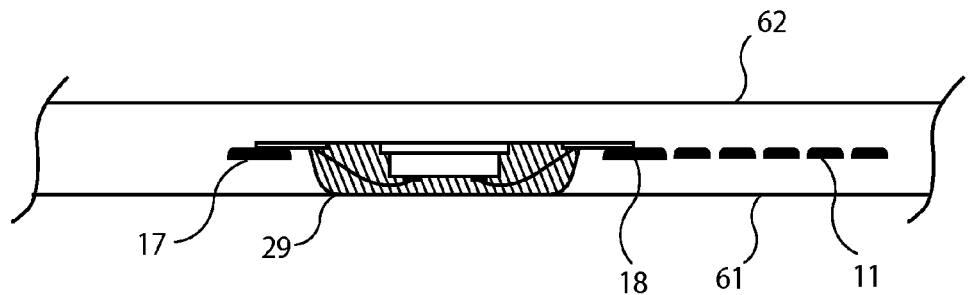

FIG. 6 illustrates the RFID obtained by welding together the three layers 10, 20 and 30 after they have been laminated.

On the figures, the elements represented are not in true proportion.

In FIG. 1, a substrate 10 in credit card format is represented in a top view. In the description that follows, this substrate is designated as "antenna support". The support features an ISO format although it may have other dimensions, and may be in the shape of strips or sheets, for example, featuring several supports to be cut out in ISO format. An undercoat 12 of 5 µm thick is applied to the antenna support 10 over a zone represented in gray in FIG. 1. For example, this undercoat is made by printing with an ink, resin or varnish. According to one embodiment of the invention, the undercoat 12 consists of a transparent ink that is tinted to facilitate visual identification. According to the preferred embodiment of the invention, the antenna support 10 is made of polycarbonate (PC). An antenna 11, consisting of a winding of several turns, two contacts 17 and 18 located at both ends of the winding and an electric bridge 13, is printed on the antenna support 10 on the undercoat 12 and so as not to extend past the zone defined by the undercoat. The zone occupied by the undercoat 12 is preferably slightly larger than the imprint of the antenna, as can be seen in FIG. 1. The shape of the zone is thus directly determined by the shape of the antenna.

The turns of the antenna and the contacts are made by screen printing, flexography, rotogravure, offset printing or inkjet printing with epoxy type conductive ink loaded with conductive particles such as, for example, silver or gold or with a conductive polymer. According to another embodiment, the antenna is printed directly on the antenna support without undercoat 12. According to the two embodiments, with and without undercoat, the antenna is printed in several passes. The first pass consists in printing the two contacts 17 and 18 of the antenna and the electric bridge 13, commonly referred to as "cross-over". The second pass consists in printing an insulating strip 16 made of dielectric material overlaid at the cross-over. The third printing pass consists in printing turns whose inner end 14 and outer end 15 intersect with the electric bridge 13, by passing over it, so as to be electrically connected together. The insulating strip 16 thus enables an overlap zone of the antenna to be obtained where the electric bridge 13 and the turns of the antenna intersect without risk of short-circuit. The overlaying of overlapping turns and the dielectric reaches a thickness between 70 and 75 µm.

A perforation 19 is made in the antenna support between contacts 17 and 18. The perforation is made with a laser or a punch.

According to FIG. 2, an integrated circuit module 29 features a chip 25, and at least two groups of contacts 23 and 24. The connection between the chip and the groups of contacts 23 and 24 is made by conductive wires or connecting cables 26, commonly referred to as "wire bonding". The chip 25 and the wires are encased in a resistant material-based protective resin 27 that does not conduct electricity. The encapsulation 27 (or "molding") is in a way a stiff shell that surrounds the chip and its wiring in order to make it less fragile and easier to handle. The encapsulation has a thickness between 200 and 240 µm. The module thus presents on its upper face a flat surface corresponding to the upper portion of the encapsulation 27 and on its lower face groups of contacts 23 and 24 designed to connect to a circuit. The groups 23 and 24 are made of conductive material such as aluminum and their thickness is between 70 and 100 µm.

The module 29 is glued to the antenna support layer by means of two dots of adhesive material 33 and 34 placed next to the antenna contacts or straddling the antenna contacts 17 and 18. The module is positioned so that the contacts 17 and 18 are located opposite the groups of contacts 23 and 24 of the module and so that the encased part of the module or encapsulation 27 is in the recess 19. And in particular, a part of the contacts 17 and 18 press against part of the groups of contacts 23 and 24 not covered by adhesive material. The adhesive material used for the dots 33 and 34 is a glue that only bonds the module to the support layer 10 and, as this glue is non-conducting, it does not directly participate in the electrical connection between the module and the antenna. The glue used is a hot-curable epoxy type adhesive, not loaded with conductive particles. The dots of glue are placed on the support layer 10 near the antenna supports so that, when the module 29 is installed in the recess 19, the glue of the dots is squashed by a small part of the groups of contacts of the module until they come in contact with the antenna contacts. The dots of glue then attain the same or substantially the same thickness as the antenna contacts and become flush with the antenna contacts. The operation that consists in placing the module in the recess includes a heating phase of the groups of contacts of the module that enables cross-linking of the glue. The dots of glue harden under the effect of the heat and thus maintain the groups of contacts of the module 23 and 24 in contact against the contacts. This glue baking step is performed locally by applying, without pressure, a heating element against the groups of contacts of the module.

The tight contact of the groups of contacts 23, 24 of the module and contacts 17, 18 of the antenna guarantee the reliability of the electrical connection. In this manner, as soon as the module 29 is installed in the recess 19, the electrical connection is made by the portion of the groups of contact 23, 24 of the module in direct contact with contacts 17 and 18 of the antenna. The support thus obtained is an antenna support equipped with a module integral with the support and electrically connected to the antenna. In this way, the electrical connection has the advantage of being made without the need for soldering or adding material.

According to an embodiment of the invention, the antenna contacts 17 and 18 have a concave or hollow shape or are hollowed out like a ring so that the dots of adhesive material 33 and 34 are placed inside the hollow part of the concave shape or inside the recess. In a preferred embodiment of the invention, the antenna contacts are U-shaped so that the dots of adhesive material are placed inside the U.

According to FIG. 3, a second layer 20 is represented in a top view. This second layer is a polycarbonate (PC) layer having a thickness between 50 and 60 µm and width and length identical to the first layer of the antenna support 10. Two perforations 26 and 39 are made in this layer with either a laser or punch. These two perforations are cavities passing through the entire thickness of the layer 20. The perforation 26 is located on the layer 20 so that, when the layer 20 covers the layer 10 by overlaying edge to edge, the insulating strip 16 appears in the space left by the perforation 26. In this way, the perforation 26 is centered on the insulating strip. Likewise, the perforation 39 is located on the layer 20 so that the layer 20 covers the layer 10 by overlaying edge to edge, the part located between the contacts and a part of the contacts appears in the space left free by the perforation 39. In this way, the perforation 39 is centered on the module 29.

FIG. 4 represents a cross-sectional view of the antenna support 10 along axis A-A of FIG. 1, the second layer 20 and the third layer 30. According to the manufacturing process of the device according to the invention, the layer 20 is positioned on the support 10 so that the external face of the module, thus the one featuring the groups of contacts of the module, fits into the perforation 39. A third layer 30 is also positioned on the layer 20. The layer 30 is a sheet of polycarbonate (PC) whose dimensions are identical to those of the two other layers and having a thickness between 90 and 120 pm and preferably equal to 100 µm. FIG. 5 represents a cross-sectional view of the antenna support 10 along axis B-B of FIG. 1 and the second and third layers 20 and 30. During the positioning step of layers 20 and 30 above the antenna support 10, the insulating strip 16 fits into the perforation 26.

The next step consists in laminating layers 10, 20 and 30 together. The three layers are subjected to an increase in temperature up to 180° C. and an increase in pressure. During the lamination, the intermediate layer 20 softens at temperatures less than the lower and upper layers 10 and 30. Owing to the pressure exerted during the lamination step, the air trapped between the layers, and particularly in the perforations 26 and 39, is expelled and replaced by the softened polycarbonate. In this way, the polycarbonate of the intermediate layer 20 fills the perforations during the lamination step. The layer 20 equipped with its two perforations avoids and compensates for excess thickness due to the overlap zone of the module and the antenna.

Following this lamination step, the three layers 10, and 30 are welded together as shown in FIG. 6. Once welded together, the various layers of polycarbonate can no longer be distinguished in the thickness of the RFID obtained so that delamination cannot occur in the thickness. The antenna 11, featuring the turns, the two contacts 17 and 18 and the electric bridge 13, is fully encased in the polycarbonate of the three layers 10, 20 and 30 welded together. The edges of the RFID according to the invention are uniform and do not have demarcation lines parallel to the upper edges 62 and lower edges 61 which may be considered as an assembly of several layers; this makes it impossible to delaminate the device through its thickness.

According to a variant of the embodiment of the invention, the integrated circuit module is replaced by a bare chip of the type of the chip 25 encased in the module. According to this variant, not shown in the figures, the antenna realization steps and the step for laminating the layers together are the same than in the embodiment described with an integrated circuit module. However, the perforation 19 is not necessary in the case of a chip. The perforations 26 and 39 are made in the same manner in the layer 20; the perforation 39 being centered on the chip. The chip is connected to the antenna according to a method of the of the type described in application FR 2 826 153 of the applicant. Adhesive dielectric material is applied to the antenna support 10 between the contacts 17, 18 of the antenna and the chip is positioned on the antenna support so that the contacts of the chip are against the antenna contacts. The adhesive material is then subjected to heat treatment in order to harden it.

In this embodiment, the pressure exerted on the chip during its connection to the antenna enables the contacts of the chip, commonly referred to as "bumps", to penetrate into the antenna contacts which deform and thus guarantee a better connection between the chip and the antenna.

The RFID according to the invention forms a flat support that can be built into a security document such as an identity card, an identity booklet, a driver's license, an access card, etc.

The RFID according to the invention has a thickness between 0.38 and 0.41 mm and has the advantage of being compatible with laser engraving.

The invention claimed is:

1. A method for manufacturing a radio frequency identification device (RFID) comprising a flat substrate equipped with an antenna (14) and a chip (25) connected to the antenna, said antenna formed by the winding of several turns (11) comprises a zone where the turns overlap, an insulating strip (16) of dielectric material separating the overlaid antenna turns where they overlap, the method including the following steps:
   a) producing the antenna consisting in printing turns, two contacts (17, 18) of conductive ink and an insulating strip (16) made of dielectric material at the location where the turns overlap, and in subjecting said substrate to heat treatment in order to bake said ink,
   b) connecting said chip (25) to said substrate (10) of the side of said antenna (14),
   c) overlaying a second layer (20) on said substrate on the side of the antenna, this second layer comprising a first perforation (39) centered on the chip and a second perforation (26) centered on said insulating strip (16) of antenna overlap zone,
   d) overlaying a third layer (30) on the second layer,
   e) laminating the three layers together (10, 20, 30),
   wherein said second perforation (2) passes through an entire thickness of said second layer (20) and
   wherein step a) includes the following steps:
   a1) printing an undercoat (12) comprising an ink, resin or varnish on a predetermined zone on said antenna support substrate (10), said zone corresponding to an imprint of the antenna or being slightly larger than it, and
   a2) printing the antenna on said undercoat (12).

2. The method according to claim 1, in which said layers (10, 20, 30) are made of polycarbonate (PC).

3. The method according to claim 2, in which the polycarbonate of the layers (10, 20, 30) is transparent.

4. The method according to claim 1 in which step b) includes the following steps:
   b1) placing adhesive dielectric material between said contacts (17, 18) of the antenna,
   b2) positioning said chip (25) so that the contacts of the chip are against said contacts (17, 18) of the antenna,
   b3) subjecting said adhesive material to heat treatment in order to harden it.

5. The method according to claim 1, in which step b) includes the following steps:
   b1) creating a perforation (19) between said contacts (17 and 18) of the antenna,
   b2) placing adhesive dielectric material (33, 34) on part of said contacts (17, 18) of the antenna,
   b3) positioning said chip, encased in a module (29), so that contacts (23, 24) of said module (29) are against said contacts (17, 18) of the antenna and that an encapsulation (27) of the module is in said recess,
   b4) subjecting said adhesive material (33, 34) to heat treatment in order to harden it.

6. The method according to claim 5, in which the contacts (17, 18) of the antenna are U-shaped.

7. The method according to claim 5, in which the adhesive material (33, 34) is a hot-curable epoxy adhesive.

8. The method according to claim 1, in which said perforations (19, 26, 39) are made by laser or with a punch before the step of overlaying the layers on top of one another.

9. The method according to claim 1, in which said undercoat (12) is a transparent ink that is tinted to facilitate visual identification.

10. A radio frequency identification device (RFID) obtained according to claim 1, comprising
   a flat and flexible substrate made of polycarbonate equipped with an antenna (14) composed of conductive ink fully encased in the polycarbonate and a chip (25) or integrated circuit module (29) connected to the antenna,
   said antenna formed by the winding of several turns features a turn overlap zone, an insulating strip of dielectric material (16) separating the overlaid antenna turns in the overlap zone,
   the edges of the device being completely uniform so that no lines of demarcation between the various layers are visible, thereby preventing all attempt of delamination of the device over its thickness.

* * * * *